United States Patent
Wing et al.

(10) Patent No.: US 6,683,378 B2
(45) Date of Patent: Jan. 27, 2004

(54) SYSTEM FOR SINGULATING SEMICONDUCTOR COMPONENTS UTILIZING ALIGNMENT PINS

(75) Inventors: Jason C. Wing, Kuna, ID (US); Gregory M. Chapman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/425,490

(22) Filed: Apr. 29, 2003

(65) Prior Publication Data

US 2003/0200855 A1 Oct. 30, 2003

Related U.S. Application Data

(62) Division of application No. 09/944,034, filed on Aug. 30, 2001.

(51) Int. Cl.$^7$ .......................... H01L 23/34; B65D 85/00
(52) U.S. Cl. ...................... 257/726; 257/727; 257/730; 257/773; 206/711
(58) Field of Search ................................ 257/678, 685, 257/686, 723, 724–727, 730, 734, 773, 776; 83/13, 23, 25, 27, 53, 78, 84–86, 167, 929, 929.1; 206/710, 711; 414/935, 936, 939; 451/364, 388, 490, 494; 269/20, 21, 903; 438/22, 33, 106, 107, 110, 113, 455, 458, 460, 464, 365, 368, 386; 174/50; 29/25.01, 412, 592; 361/600, 679, 724–726, 728–730, 732, 736, 740, 748, 749, 752, 756, 759, 784, 796, 801, 802, 807, 810

(56) References Cited

U.S. PATENT DOCUMENTS

| | | | | |
|---|---|---|---|---|
| 3,811,182 A | * | 5/1974 | Ryan et al. | 29/25.01 |
| 4,685,363 A | * | 8/1987 | Gerber | 83/22 |
| 5,803,797 A | * | 9/1998 | Piper | 451/182 |
| 6,024,631 A | * | 2/2000 | Piper | 451/41 |
| 6,165,232 A | | 12/2000 | Tieber et al. | 29/25.01 |
| 6,187,654 B1 | | 2/2001 | Tiber et al. | 438/464 |
| 6,239,380 B1 | | 5/2001 | Drussel et al. | 174/250 |
| 6,255,196 B1 | | 7/2001 | Akram et al. | 438/455 |
| 6,448,156 B1 | * | 9/2002 | Tieber | 438/464 |
| 2003/0051338 A1 | * | 3/2003 | Buley et al. | 29/830 |
| 2003/0060025 A1 | * | 3/2003 | Tieber | 438/464 |

* cited by examiner

Primary Examiner—Alonzo Chambliss
(74) Attorney, Agent, or Firm—Stephen A. Gratton (57) ABSTRACT

A method for singulating a substrate containing semiconductor components is performed using a nest for holding the substrate, a prestage alignment base for aligning the substrate during a prestage alignment step, and a vacuum cutting base for holding the nest and the substrate during a cutting step. The prestage alignment base includes locator pins configured to engage locator openings on the substrate to align the substrate on the nest. As the cutting base does not include the locator pins, the cutting step can be performed without saw scrap collecting on the locator pins. A system for performing the method includes the nest and the prestage alignment base having the locator pins configured to engage the locator openings on the substrate. The system also includes the sawing base which includes pedestals with vacuum conduits for holding the substrate stationary on the nest for sawing. The system also includes the saws, and a vacuum source in flow communication with the vacuum conduit and pedestals on the sawing base.

27 Claims, 9 Drawing Sheets

SYSTEM FOR SINGULATING SEMICONDUCTOR COMPONENTS UTILIZING ALIGNMENT PINS

CROSS REFERENCE TO RELATED APPLICATIONS

This application is a division of Ser. No. 09/944,034 filed on Aug. 30, 2001 now pending.

BACKGROUND OF THE INVENTION

This invention relates generally to semiconductor packaging. More particularly, this invention relates to a method and to a system for singulating semiconductor components contained on a substrate.

Semiconductor components, such as packages, multi chip modules, printed circuit boards and interconnects are typically fabricated on a substrate which contains multiple components. The substrate can comprise a panel containing one or more rows of components, or one or more arrays of components in a matrix of rows and columns. Following the fabrication process the substrate is singulated into individual components.

BGA packages and chip scale packages, for example, can be fabricated on a substrate made of a circuit board material, such as bismaleimide triazine (BT). Typically, the singulation process is performed by cutting the substrate, such that each component includes a "component substrate" formed by a portion of the substrate. One method for cutting the substrate uses diamond tipped saw blades, similar to the blades used to dice semiconductor wafers into individual dice. In addition, the substrate can include locator openings for receiving locator pins, which are adapted to align the substrate to the saw blades during the sawing step of the singulation process.

Figures 1A, 1B:
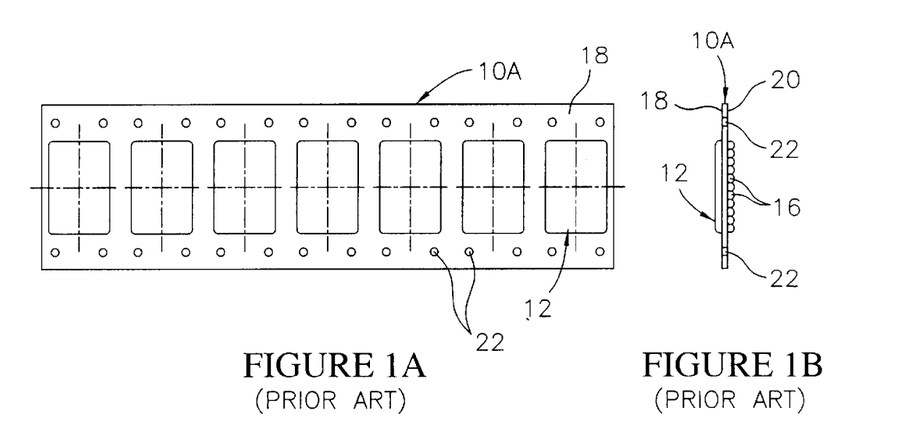
FIG. 1A is a plan view of a prior art substrate containing semiconductor components in a single row.
FIG. 1B a side elevation view of the prior art substrate.

Referring to FIGS. 1A and 1B, a prior art substrate 10A made for fabricating semiconductor components 12 is illustrated. As shown in FIG. 1A, the substrate 10A is a panel (or strip) of material similar in function to a metal leadframe. In this example, the substrate 10A comprises a circuit board material, and the components 12 comprise BGA packages arranged in a single row on the substrate 10A. However, the components 12, rather than being BGA packages, can comprise other electronic elements made with semiconductor dice, such as chip scale packages, multi chip modules or printed circuit boards. The components 12 can also comprise interconnects for electrically engaging semiconductor dice. In addition, the components 12 can be arranged in more than one row (e.g., two rows, three rows etc.).

As shown in FIG. 1B, the components 12 include an encapsulant 14 which encapsulates a semiconductor die (not shown) bonded to a first side 18 of the substrate 10A. In addition, the components 12 include external contacts 16, such as solder balls in a grid array, formed on a second side 20 of the substrate 10A in electrical communication with the die. The substrate 10A also includes locator openings 22 formed along the opposing longitudinal edges of the substrate 10A. The locator openings 22 facilitate handling of the substrate 10A by automated equipment, such as conveyors, loaders and magazines. The locator openings 22 also function to align the substrate 10A, and the components 12, on various process equipment during different fabrication processes such as singulation, die attach and wire bonding.

Figures 1C, 1D:
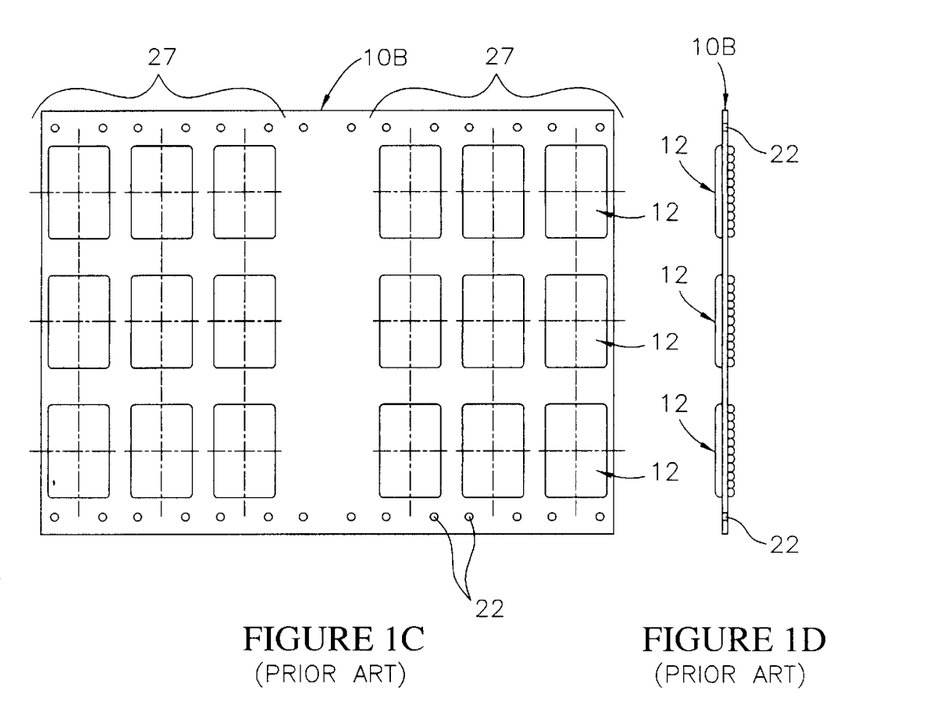
FIG. 1C is a plan view of a prior art matrix substrate containing components in one or more arrays of rows and columns.
FIG. 1D is a side elevation view of the prior art matrix substrate.

Referring to FIGS. 1C and 1D, a prior art matrix substrate 10B for fabricating the semiconductor components 12 is illustrated. The substrate 10B is substantially similar in construction to the substrate 10A described above. However, in this case the substrate 10B, following a singulation step, includes separate arrays 27, each of which includes multiple components 12 arranged in a matrix of rows and columns. As with the substrate 10A, the substrate 10B includes locator openings 22 that facilitate handling and alignment of the substrate 10B during fabrication of the components 12. As another alternative, the substrate can comprise a panel that contains a single matrix of components 12 rather than multiple arrays.

Figure 2A:
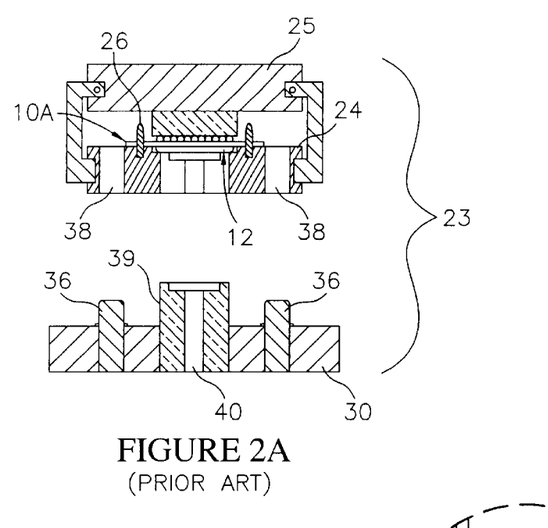
FIG. 2A is a schematic cross sectional view of a prior art singulation system.
Figures 2B, 2C:
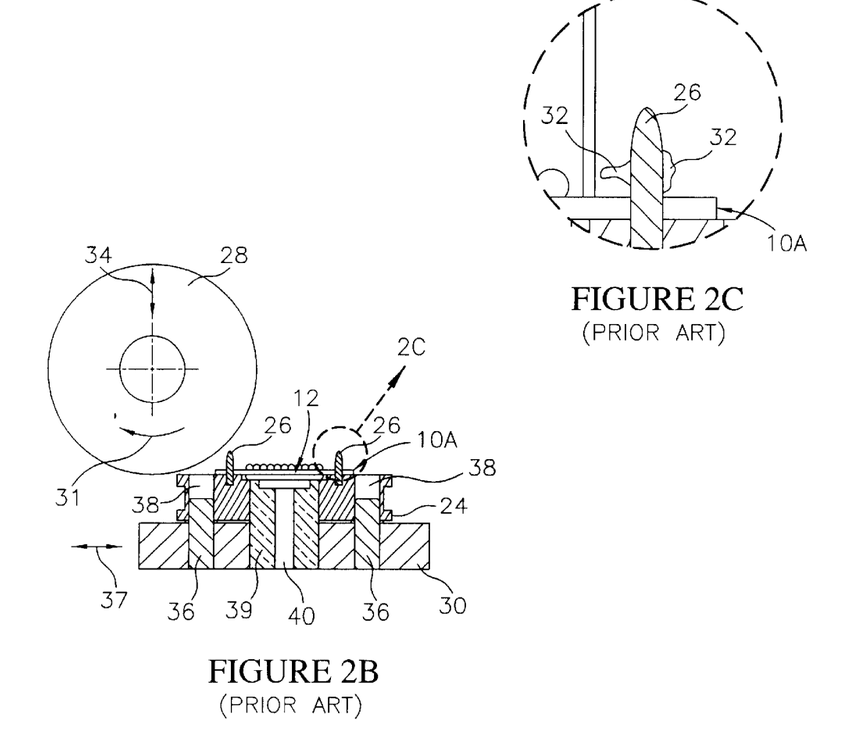
FIG. 2B is a schematic cross sectional view of the prior art singulation system during a sawing step.
FIG. 2C is an enlarged view taken along line 2C of FIG. 2B illustrating sawing scraps on a locator pin of the system.

Referring to FIGS. 2A and 2B, a prior art system 23 for singulating the substrate 10A is illustrated. The system 23 includes a nest 24 for supporting the substrate 10A, a clamp assembly 25 for clamping the substrate 10A on the nest 24, and a sawing base 30 for holding the nest 24 during a sawing step of the singulation process.

As shown in FIG. 2B, the system 23 also includes one or more saw blades 28 configured to saw the substrate 10A into the separate components 12. The saw blades 28 rotate at high rpms, as indicated by rotational arrow 31, and are also movable in the z-direction as indicated by z-direction arrow 34. The sawing base 30 is moveable in an axial directions (e.g., x-direction) as indicated by axial direction arrow 37. The saw blades 28 are configured to saw across the lateral axis, or along the longitudinal axis of the substrate 10A, as the sawing base 30 moves the substrate 10A in axial directions as required. The sawing base 30 can also be rotated about it's longitudinal axis (theta rotation) for positioning the substrate 10A for lateral or longitudinal sawing. Such a prior art system is manufactured by Intercon Tools, Inc. of Morgan Hill, Calif.

As shown in FIG. 2A, the nest 24 includes locator pins 26 which are placed through the locator openings 22 (FIG. 1A) in the substrate 10A. The locator openings 22 align the substrate 10A on the nest 24. As also shown in FIG. 2A, the substrate 10A is initially placed on the locator pins 26, and then clamped to the nest 24 using the clamp assembly 25.

As shown in FIG. 2B, the nest 24 is then placed on the sawing base 30, and the clamp assembly 25 is removed. The sawing base 30 includes mounting studs 36 that mate with mounting openings 38 on the nest 24, and also one or more vacuum conduits (not shown) for holding the nest 24 on the sawing base 30. The sawing base 30 also includes a pedestal 39, and a vacuum conduit 40, configured to apply a vacuum for holding the substrate 10A on the nest 24 once the clamp assembly 25 is removed. With the substrate 10A held on the nest 24, and the nest 24 held on the sawing base 30, the sawing step is performed by moving the sawing base 30 in the axial direction 37, such that the saw blades 28 saw across the width, or the length, of the substrate 10A as required.

One shortcoming of this prior art system 23 is that the locator pins 26 sometimes collect sawing scrap 32 (FIG. 2C) during the sawing step. The scrap 32 (FIG. 2C) can include pieces of the substrate 10A, as well as other debris from the sawing step. As the saw blades 28 rotate in close proximity to the locator pins 26, the scrap 32 (FIG. 2C) can come in contact with the rotating saw blades 28 causing bending, and in some cases breakage of the saw blades 28. As is apparent, the damaged saw blades 28 are expensive to replace. In addition, replacement of the saw blades 28 requires that the sawing equipment be shut down, which causes even more costly production delays.

Besides damaging the saw blades 28 the scrap 32 can also cause problems with loading of the substrate 10A into the nest 24, and with unloading of the singulated components 12 from the nest 24. These problems can also cause production delays, and require operators of the system 23 to manually remove the sawing scrap 32 from the locator pins 26.

The present invention is directed to a method and to a system for singulating semiconductor components in which locator pins are eliminated from the sawing step. Specifically, the invention includes a pre-stage alignment step in which the substrate is aligned for the sawing step. Although locator pins are used during the pre-stage alignment step, the locator pins are eliminated from the nest, such that scrap does not collect on the locator pins during the sawing step, and damage to the saw blades is reduced.

SUMMARY OF THE INVENTION

In accordance with the present invention, an improved method and system for singulating semiconductor components are provided. Also provided are an improved sawing nest for semiconductor components, and improved semiconductor components fabricated using the method and the system.

The method includes the step of providing a substrate containing the components, and including locator openings for locating and handling the substrate. The substrate can be in the form of a panel (or a strip) containing one or more single rows of components, or alternately a panel containing one or more arrays of components in a matrix of rows and columns. The method also includes the step of providing a prestage alignment base having locator pins, and a nest and clamping mechanism mountable to the prestage alignment base for holding the substrate. The prestage alignment base and the nest can be configured for use with a particular substrate, such as substrates having components one or more rows, or substrates having one or more arrays of components in a matrix of rows and columns.

The method also includes a prestage alignment step in which the nest is mounted to the prestage alignment base and the substrate is placed on the nest. The prestage alignment base includes mounting studs that mate with mounting openings on the base. During the prestage alignment step, the locator pins on the prestage alignment base project through openings in the nest, and engage the locator openings on the substrate to align the substrate on the nest. With the substrate aligned on the nest, the clamping mechanism is attached to the nest to maintain the alignment, and the nest is removed from the prestage alignment base and mounted to a sawing base. As with the prestage alignment base, the sawing base includes mounting studs that engage the mounting openings on the nest. The sawing base also includes pedestals having vacuum conduits in flow communication with a vacuum source adapted to hold the substrate on the nest. The sawing base can also include vacuum conduits for holding the nest on the sawing base. The sawing base is movable in axial directions, and can also be rotated about it's axis (theta rotation) for positioning the substrate for lateral or longitudinal sawing.

With the substrate held on the nest by vacuum applied through the sawing base, the clamping mechanism is removed from the nest, and a sawing step is performed using one or more saw blades. During the sawing step, the vacuum holds the substrate on the nest, and there are no locator pins to compromise the operation of the saw blades. In particular, the locator pins are contained on the prestage alignment base which is not used during the sawing step. The method thus performs a prestage alignment step with locator pins, but eliminates the locator pins from the sawing step. Following the sawing step, the vacuum can be shut off, and the singulated components can be removed from the nest using a suitable mechanism such as a pick and place mechanism. In addition, the remaining portions of the cut substrate can be removed from the nest manually, or using a suitable mechanism.

The system includes the nest and the clamping mechanism for holding the substrate, and the prestage alignment base for holding the nest. The prestage alignment base includes the mounting studs for the nest, and the locator pins projecting through openings in the nest and configured to engage the locator openings. The system also includes the sawing base, which includes the mounting studs for supporting the nest, and the pedestals with the vacuum conduits for holding the substrate stationary on the nest for sawing. The system also includes the saws, and the vacuum source in flow communication with the vacuum conduit and pedestal on the sawing base.

In an alternate embodiment system, locator pins are mounted to the prestage alignment base, and to the clamping mechanism as well.

DETAILED DESCRIPTION OF THE PREFERRED EMBODIMENTS

As used herein the term "semiconductor component" refers to an element, or to an assembly, that includes a semiconductor die, or makes an electrical connection to a semiconductor die. Exemplary semiconductor components include semiconductor packages such as BGA packages and chip scale packages, multi chip modules, printed circuit boards, interconnects, bumped dice and bare dice.

As used herein the term "substrate" refers to an element that contains multiple semiconductor components. Exemplary substrates include panels, strips and wafers made of any material used in semiconductor packaging. Exemplary materials for the substrate include circuit board materials (e.g., glass filled resins such as BT and FR-4), plastic materials, ceramic materials, and semiconductor materials such as silicon.

Figure 3:
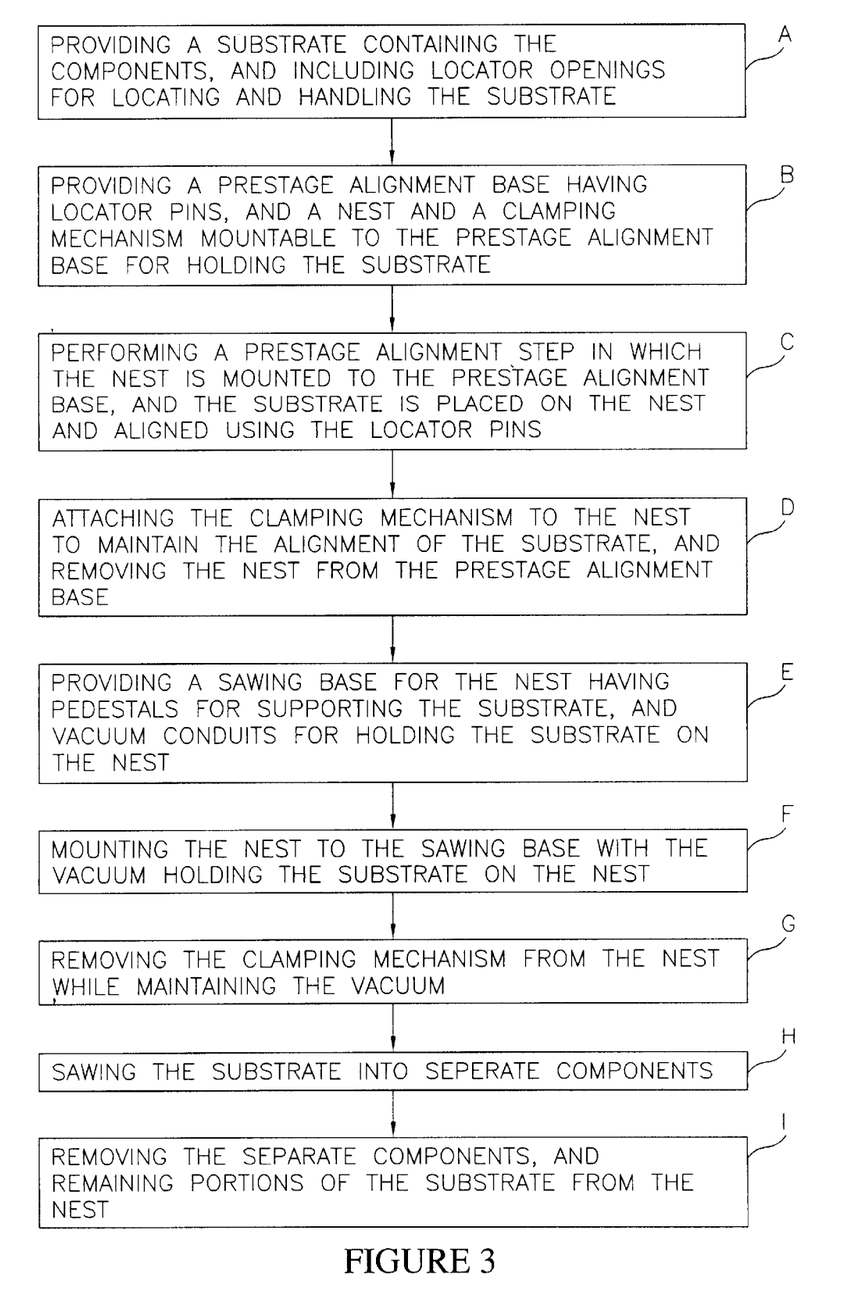
FIG. 3 is a block diagram illustrating steps in the method of the invention.

Referring to FIG. 3 broad steps in the method of the invention are illustrated. The method includes the steps of:

Step A: Providing a substrate containing the components, and including locator openings for locating and handling the substrate.

Step B: Providing a prestage alignment base having locator pins, and a nest and a clamping mechanism mountable to the prestage alignment base for holding the substrate.

Step C: Performing a prestage alignment step in which the nest is mounted to the prestage alignment base, and the substrate is placed on the nest and aligned using the locator pins.

Step D: Attaching the clamping mechanism to the nest to maintain the alignment of the substrate, and removing the nest from the prestage alignment base.

Step E: Providing a sawing base for the nest having pedestals for supporting the substrate, and vacuum conduits for holding the substrate on the nest.

Step F: Mounting the nest to the sawing base with the vacuum holding the substrate on the nest.

Step G: Removing the clamping mechanism from the nest while maintaining the vacuum.

Step H: Sawing the substrate into separate components.

Step I: Removing the separate components, and remaining portions of the substrate from the nest.

Referring to FIGS. 4A–4D, a system 50 constructed in accordance with the invention is illustrated. The system 50 includes the substrate 10A containing the components 12, and having the locator openings 22 there through. The system 50 also includes a nest 52, and a clamping mechanism 54 configured to hold the substrate 10A on the nest 52. The system 50 also includes a prestage base 56 configured to hold the nest 52 during the prestage alignment step. In addition, the system 50 includes a sawing base 58 configured to hold the substrate 10A for sawing, and one or more saw blades 60 configured to saw the substrate 10A held in the sawing base 58. The saw blades 60 are configured for rotation as indicated by rotational arrow 92, and for z-direction movement as indicated by arrow 90. In addition, the saw blades 60 are configured with axial movement of the sawing base 58 to cut across the width of the substrate 10A (e.g., across the lateral axis thereof) or along the length of the substrate 10A (e.g., along the longitudinal axis thereof).

Figure 4A:
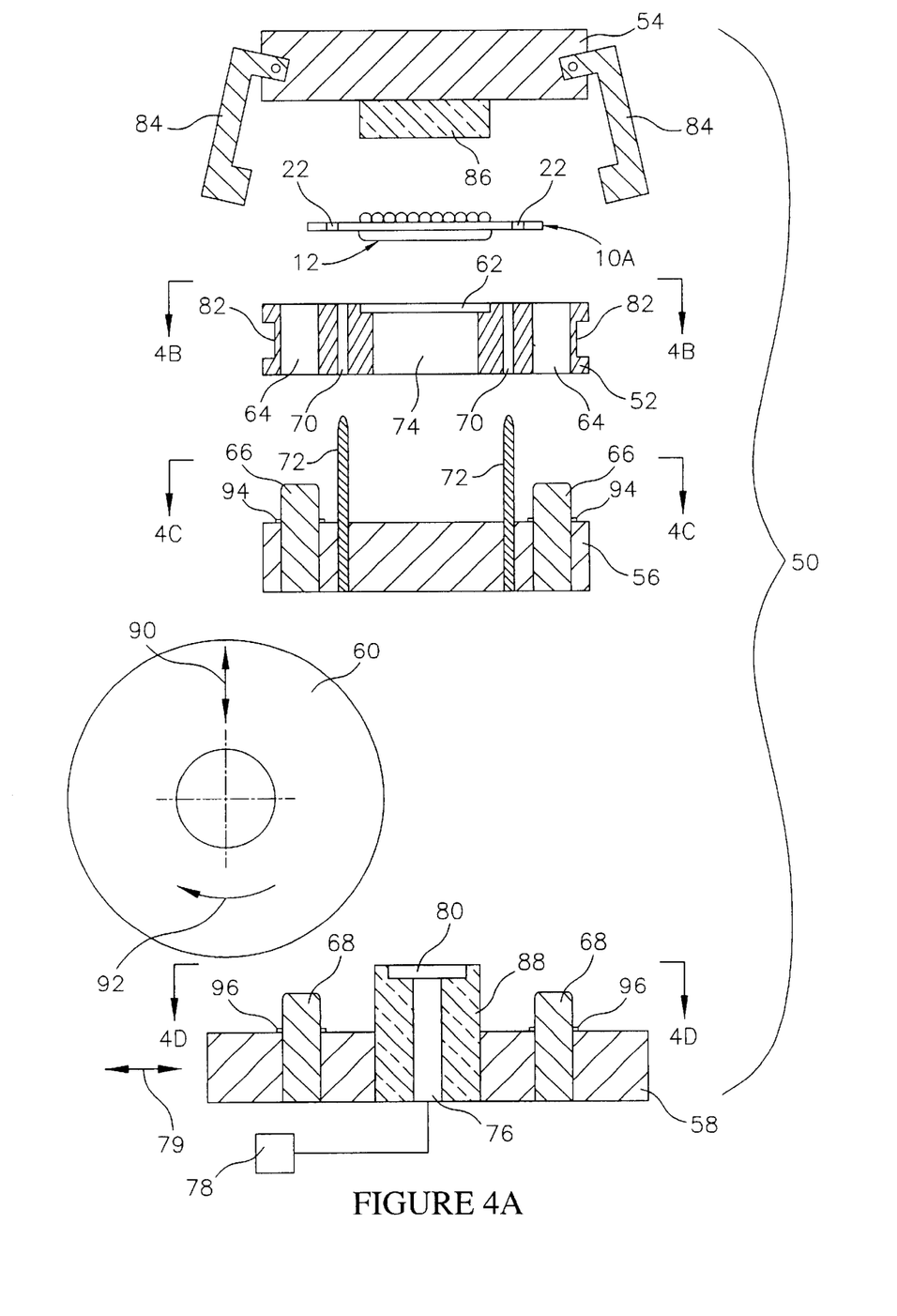
FIG. 4A is a schematic cross sectional view illustrating a system constructed in accordance with the invention.
Figure 4B:
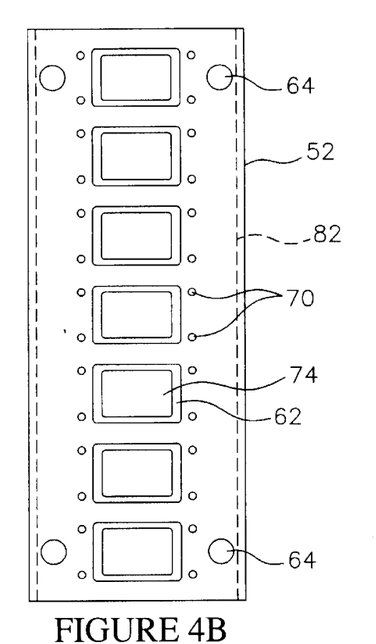
FIG. 4B is a plan view taken along line 4B—4B of FIG. 4A illustrating a nest of the system.

As shown in FIG. 4B, the nest 52 is a generally rectangular shaped block, machined or cast of a suitable material such as steel or stainless steel. The length and the width of the nest 52 correspond to, but are larger than, the length and the width of the substrate 10A. The nest 52 includes a plurality of recesses 62 configured to receive the components 12. The recesses 62 have peripheral outlines and spacings that corresponds to the peripheral outlines and spacings of the components 12 on the substrate 10A prior to singulation. The nest 52 also includes a plurality of mounting openings 64 configured to receive mounting studs 66 on the prestage base 56, or alternately to receive mounting studs 68 on the sawing base 58. The mounting openings 64 extend through the full thickness of the nest 52 and are placed proximate to the four corners of the nest 52.

As also shown in FIG. 4B, the nest 52 includes a plurality of openings 70 configured to receive locator pins 72 (FIG. 4C) on the prestage alignment base 56. As the locator pins 72 (FIG. 4C) correspond to the locations of the locator openings 22 (FIG. 4A) in the substrate 10A, the openings 70 in the nest 52 also correspond to these locations. In addition, the openings 70 extend through the full thickness of the nest 52, such that the locator pins 72 (FIG. 4C) can project from the surface of the nest 52 to engage the locator openings 22 (FIG. 4A) in the substrate 10A, substantially as shown in FIG. 5A. The nest 52 also includes pedestal openings 74 for receiving pedestals 88 (FIG. 4A) on the sawing base 58. As will be further explained, the pedestals 88 on the sawing base 58 are placed through the pedestal openings 74 in the nest 52 to support the substrate 10A for sawing.

As shown in FIG. 4A, the nest 52 also includes slots 82 on opposing sides thereof, for receiving latches 84 on the clamping mechanism 54. The latches 84 are hingedly mounted to the clamping mechanism 54 to permit engagement and disengagement with the slots 82. The clamping mechanism 54 also includes one or more compliant pads 86 configured to bias the substrate 10A and the components 12 on the substrate 10A against the nest 52. The compliant pads 86 can comprise a resilient material such as rubber or silicone.

Figure 4C:
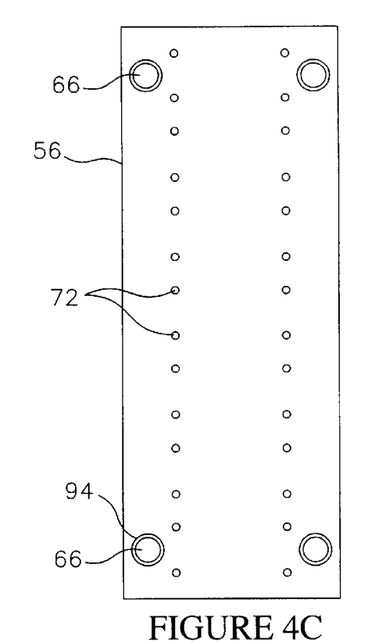
FIG. 4C is a cross sectional view taken along line 4C—4C of FIG. 4A illustrating a prestage base of the system.
Figure 5A:
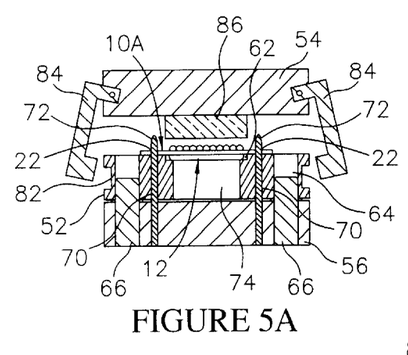
FIGS. 5A–5H are schematic cross sectional views illustrating components of the system performing steps in the method of the invention.

As shown in FIG. 4C, the prestage alignment base 56 is a generally rectangular shaped block which corresponds in size and shape to the nest 52. The prestage alignment base 56 can be machined or cast out of a suitable material such as steel or stainless steel. The prestage alignment base 56 includes mounting studs 66 configured to engage the mounting openings 64 (FIG. 4B) in the nest 52 to mount the nest 52 to the prestage alignment base 56. The prestage alignment base 56 also include standoffs 94 circumjacent to the mounting studs 66 for spacing the nest 52 from the prestage alignment base 56. As also shown in FIG. 4C, the prestage alignment base 56 includes the locator pins 72 configured to pass through the openings 70 (FIG. 4A) in the nest 52 to engage the locator openings 22 (FIG. 4A). The locator pins 72 can comprise metal pins, press fitted or welded to the prestage alignment base 56, and having a height that is greater than the thickness of the nest 52.

Figure 4D:
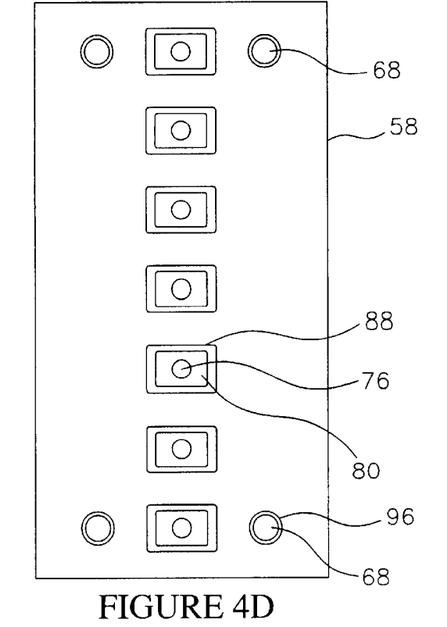
FIG. 4D is a plan view taken along line 4D—4D of FIG. 4A illustrating a sawing base of the system.

As shown in FIG. 4D, the sawing base 58 is a generally rectangular shaped block which corresponds in size and shape, but is slightly larger than the nest 52. The sawing base 58 can be machined or cast out of a suitable material, such as steel or stainless steel. As shown in FIG. 4A, the sawing base is moveable in axial directions as indicated axial direction arrow 79, and can also be rotated about it's axis (theta rotation) for positioning the substrate 10A for lateral or longitudinal sawing.

As shown in FIG. 4A, the sawing base 58 includes mounting studs 68 configured to engage the mounting openings 64 (FIG. 4B) in the nest 52 to mount the nest 52 to the sawing base 58. The sawing base 58 also include standoffs 96 circumjacent to the mounting studs 68 for spacing the nest 52 from the sawing base 58. As shown in FIG. 4D, the sawing base 58 includes a plurality of pedestals 88 configured to extend into the pedestal openings 74 (FIG. 4A) in the nest 52. The pedestals 88 are fabricated out of a resilient material such as rubber or plastic, and include vacuum openings 80, and vacuum conduits 76, in flow communication with a vacuum source 78 (FIG. 4A).

Referring to FIGS. 5A–5H, steps in the method for singulating the substrate 10A using the system 50 (FIG. 4A) are illustrated. Initially, as shown in FIG. 5A, the prestage alignment step is performed. For performing this step the nest 52 is placed on the prestage alignment base 56 with the mounting studs 66 on the prestage alignment base 56 engaging the mounting openings 64 in the nest 52. In addition, the locator pins 72 on the prestage alignment base 56 extend through the openings 70 in the nest 52, such that the substrate 10A can be placed on the nest 52 with the locator pins 72 engaging the locator openings 22 in the substrate 10A. The locator pins 72 and the locator openings 22 thus precisely align the substrate 10A on the nest 52.

Also with the substrate 10A aligned on the nest 52, the components 12 are retained in the recesses 62 on the nest 52. In this illustrative embodiment the components 12 are oriented "face down" on the nest 52 in a "dead bug" configuration. However, the components 12 can also be oriented "face up" in a "live bug" configuration. The prestage alignment step can be performed manually or using automated equipment such as conveyor tracks and loaders.

Figure 5B:
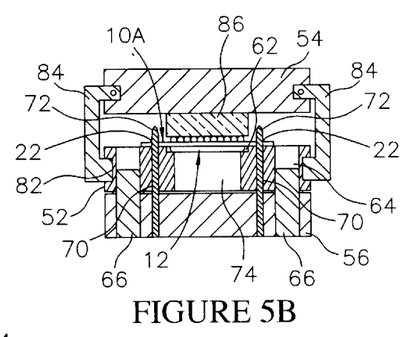

Next, as shown in FIG. 5B, following the prestage alignment step, the clamping mechanism 54 is attached to the nest 52 with the latches 84 engaging the slots 82 on the nest 52. In addition, the compliant pads 86 on the clamping mechanism 54 press against the backside of the components 12 to bias the components 12 and the substrate 10A against the nest 52.

Figure 5C:
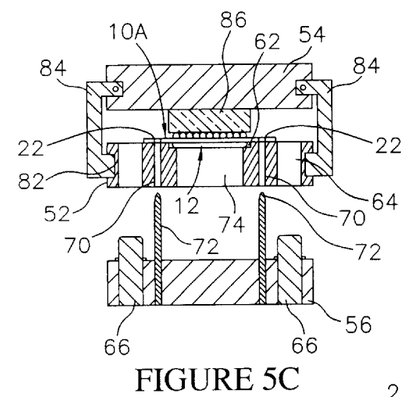

Next, as shown in FIG. 5C, the nest 52 with the clamping mechanism 54 attached thereto, is removed from the prestage alignment base 56. During the removal step the nest 52 and the clamping mechanism 54 retain and protect the substrate 10A, and maintain the alignment of the substrate 10A on the nest 52.

Figure 5D:
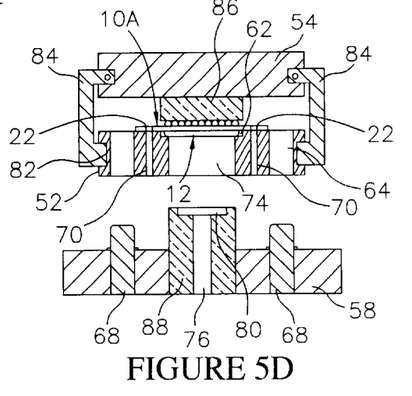

Next, as shown in FIG. 5D, the nest 52 is transported to the sawing base 58 and aligned with the sawing base 58. During the transport step the nest 52 and the clamping mechanism 54 retain and protect the substrate 10A, and maintain the alignment of the substrate 10A on the nest 52.

Figure 5E:
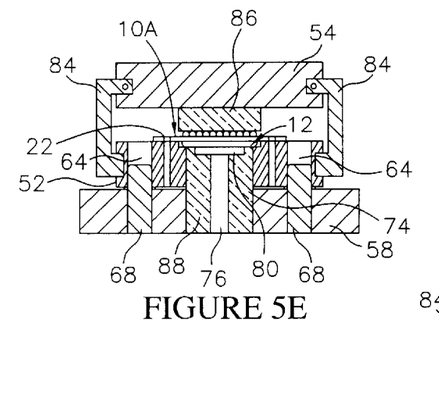

Next, as shown in FIG. 5E, the nest 52 is placed on the sawing base 58 such that the mounting studs 68 on the sawing base 58 engage the mounting openings 64 in the nest 52. A vacuum can be applied through vacuum conduits (not shown) in the sawing base 58 to hold the nest 52 on the sawing base 58. In addition, the pedestals 88 on the sawing base 58 extend into the pedestal openings 74 in the nest 52 with the vacuum openings 80 engaging the components 12. A vacuum is then applied through the vacuum openings 80 in the sawing base 58 to hold the components 12 in the recesses 62 in the nest 52. During this step the locator openings 22 on the substrate 10A are not used.

Figure 5F:
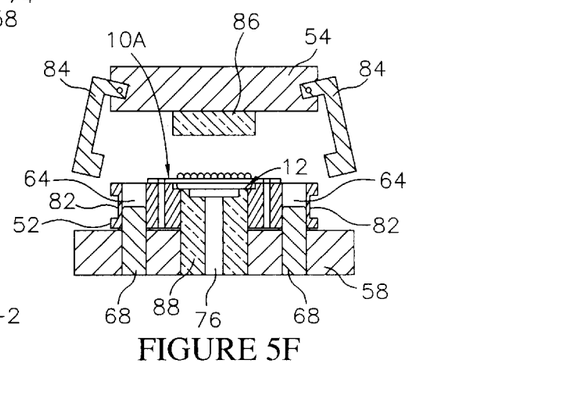

Next, as shown in FIG. 5F, the clamping mechanism 54 is removed from the nest 52 by disengaging the latches 84 from the slots 82 on the nest 52. The substrate 10A and the components 12 are now "unclamped" and retained on the nest 52 by the vacuum applied through the vacuum openings 80. In addition, the vacuum maintains the alignment of the substrate 10A on the nest 52.

Figure 5G:
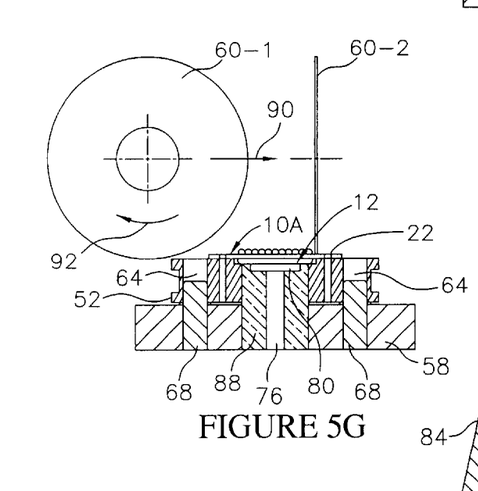

Next, as shown in FIG. 5G, a sawing step is performed in which the saw blades 60-1 and 60-2 are moved in z-directions as required to engage or disengage the substrate 10A, and the sawing base 58 is moved in axial directions, as required such that the saw blades 60-1 and 60-2 separate the individual components 12 from the substrate 10A. During the sawing step, the substrate 10A and the components 12 are now retained on the nest 52 by the vacuum applied through the vacuum openings 76. In addition, there are no locator pins 72 (FIG. 5A) on the sawing base 58 to compromise the operation of the saw blades 60-1 and 60-2.

Following the sawing step, the vacuum is removed and the singulated components 12 are removed from the nest 52. In addition, the remaining portions of the substrate 10A can be removed from the nest 52 as well.

Figure 5H:
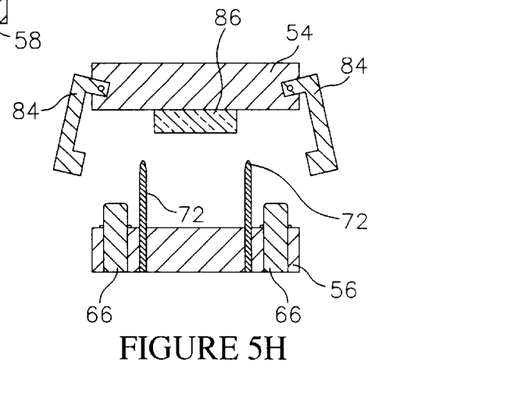

Next, as shown in FIG. 5H, the empty nest 52 can be transported back to the location of the prestage alignment base 56 and the clamping mechanism 54, and the cycle can be repeated for singulating another substrate 10A.

Figure 6:
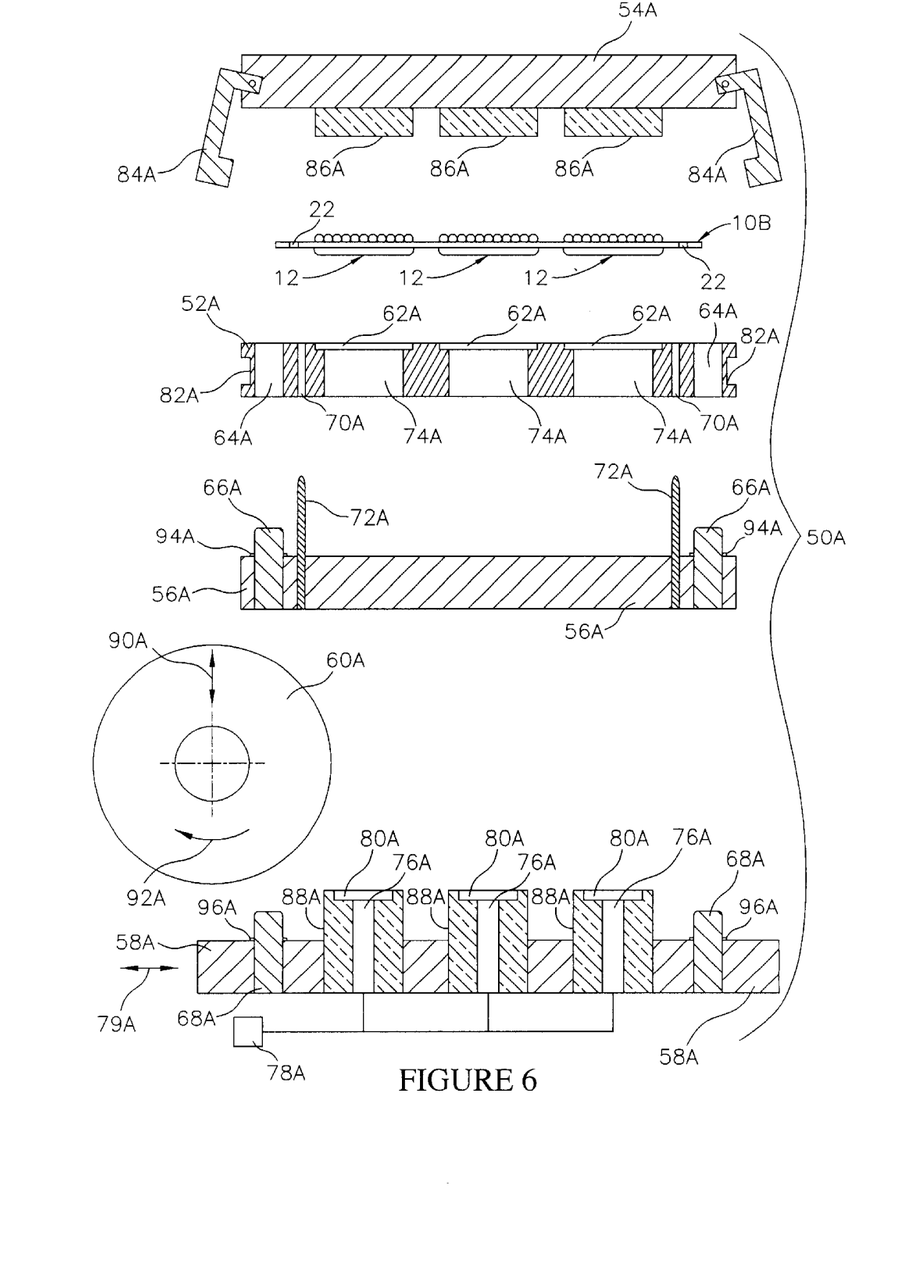
FIG. 6 is a schematic cross sectional view of an alternate embodiment system configured to singulate the matrix substrate.

Referring to FIG. 6, an alternate embodiment system 50A is illustrated. The system 50A is substantially similar in construction to the previously described system 50, but is configured to singulate the matrix substrate 10B. The system 50A includes the substrate 10B containing the components 12, and having the locator openings 22 there through. The system 50A also includes a nest 52A, and a clamping mechanism 54A configured to hold the substrate 10B on the nest 52A. The system 50A also includes a prestage base 56A configured to hold the nest 52A during the prestage alignment step. In addition, the system 50A includes a sawing base 58A configured to hold the nest 52A and the substrate 10B, and to move the substrate 10B in axial directions as indicated by axial direction arrow 79A. The system 50A also includes one or more saw blades 60A which are rotatable as indicated by arrow 92A, and moveable in the z-direction as indicated by z-direction arrow 90A. The saw blades 60A are configured to saw the substrate 10B held in the sawing base 58A in lateral and longitudinal directions, substantially as previously described.

Still referring to FIG. 6, the nest 52A includes a plurality of recesses 62A configured to receive the components 12. The nest 52A also includes a plurality of mounting openings 64A configured to receive mounting studs 66A on the prestage base 56A, or alternately to receive mounting studs 68A on the sawing base 58A. The mounting openings 64A extend through the full thickness of the nest 52A and are placed proximate to the four corners of the nest 52A. The nest 52A also includes a plurality of openings 70A configured to receive locator pins 72A on the prestage alignment base 56A. The nest 52A also includes pedestal openings 74A for receiving pedestals 88A on the sawing base 58. The nest 52A also includes slots 82A on opposing sides thereof, for receiving latches 84A on the clamping mechanism 54A. The latches 84A are hingedly mounted to the clamping mechanism 54A to permit engagement and disengagement with the slots 82A. The clamping mechanism 54A also includes one or more compliant pads 86A configured to bias the substrate 10B and the components 12 on the substrate 10B against the nest 52A.

Still referring to FIG. 6, the prestage alignment base 56A includes mounting studs 66A configured to engage the mounting openings 64A in the nest 52A to mount the nest 52A to the prestage alignment base 56A. The prestage alignment base 56A also include standoffs 94A circumjacent to the mounting studs 66A for spacing the nest 52A from the prestage alignment base 56A. The prestage alignment base 56A also includes the locator pins 72A configured to pass through the openings 70A in the nest 52A to engage the locator openings 22 in the substrate 10B.

Still referring to FIG. 6, the sawing base 58A includes mounting studs 68A configured to engage the mounting openings 64A in the nest 52A to mount the nest 52A to the sawing base 58A. The sawing base 58A also include standoffs 96A circumjacent to the mounting studs 68A for spacing the nest 52A from the sawing base 58A. The sawing base 58A also includes a plurality of pedestals 88A configured to extend into the pedestal openings 74A in the nest 52A. The pedestals 88A are fabricated out of a resilient material such as rubber or plastic, and include vacuum openings 80A, and vacuum conduits 76A, in flow communication with a vacuum source 78A. The sawing base 58A can also include vacuum conduits for holding the nest 52A on the sawing base 58A.

Figure 7:
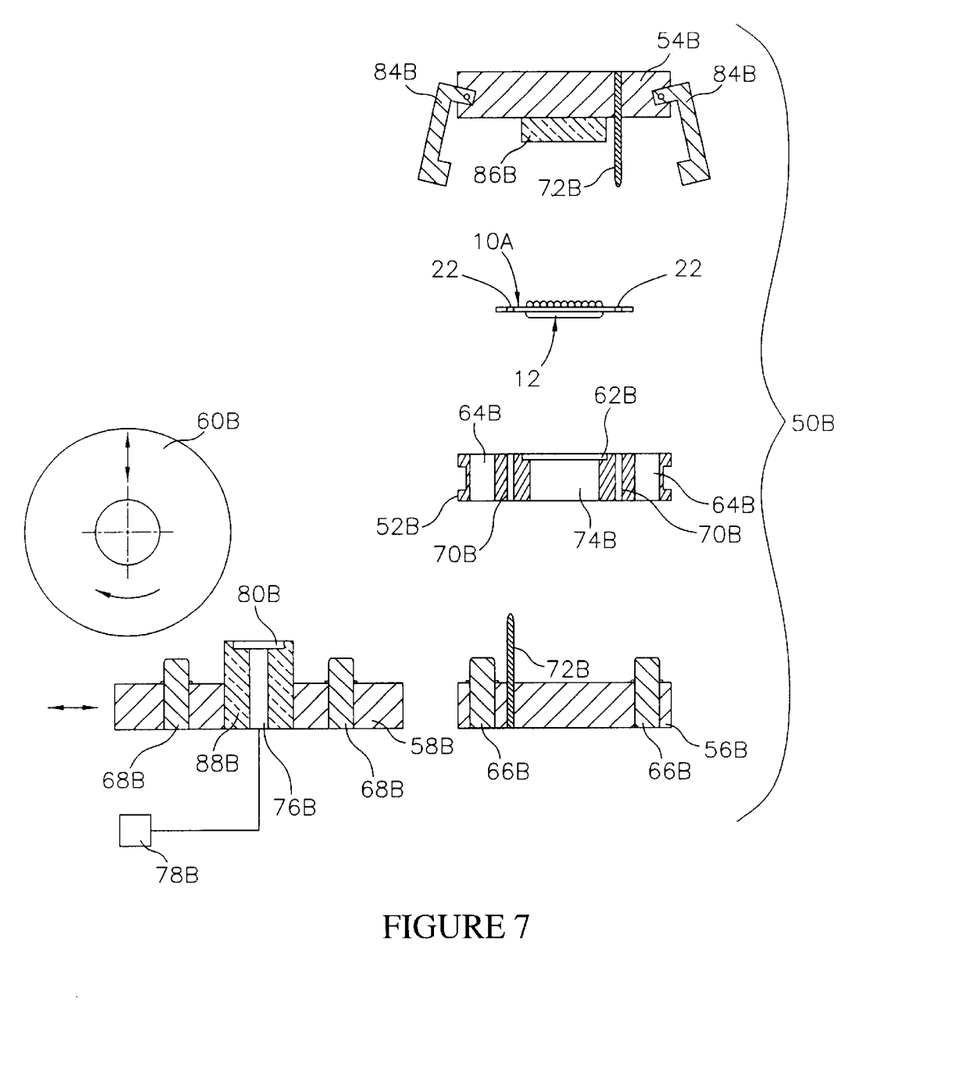
FIG. 7 is a schematic cross sectional view of an alternate embodiment system having locator pins in a clamp assembly of the system.

Referring to FIG. 7, an alternate embodiment system 50B is illustrated. The system 50B is substantially similar in construction to the previously described system 50, but includes locator pins 72B on a clamping mechanism 54B, and on a prestage alignment base 56B as well. In this embodiment a nest 52B includes openings 70B for receiving the locator pins 72B on the clamping mechanism 54B, and for receiving the locator pins 72B on the prestage alignment base 56B. The nest 52B also includes recesses 62B for the components 12 and pedestal openings 74B. In addition to the locator pins 72B, the clamping mechanism 54B includes latches 84B and complaint pads 86B.

Still referring to FIG. 7, the system 50B also includes a prestage base 56B having mounting studs 66B configured to engage mounting openings 64B in the nest 52B to hold the nest 52B during the prestage alignment step. In addition, the system 50B includes a sawing base 58B configured to hold the substrate 10A for sawing, and saw blades 60B configured to saw the substrate 10A held in the sawing base 58B. The sawing base 58B includes mounting studs 68B and pedestals 88B. The pedestals 88B include vacuum openings 80B and vacuum conduits 76B in flow communication with a vacuum source 78B, substantially as previously described.

Thus the invention provides an improved method, and system for fabricating semiconductor components such as packages, interconnects, printed circuit boards, and multi chip modules. Although the invention has been described with reference to certain preferred embodiments, as will be apparent to those skilled in the art, certain changes and modifications can be made without departing from the scope of the invention as defined by the following claims.

We claim:

1. A system for singulating semiconductor components contained on a substrate having a plurality of locator openings comprising:

a nest configured to hold the substrate;

an alignment base configured to support the nest and to align the substrate on the nest, the alignment base comprising a plurality of locator pins configured to project from openings in the nest on the alignment base to engage the locator openings to align the substrate on the nest; and a sawing base configured to support the nest and having vacuum openings configured to apply a vacuum to the substrate to hold the substrate on the nest for sawing.

2. The system of claim 1 further comprising a clamping mechanism attachable to the nest configured to clamp the substrate to the nest.

3. The system of claim 1 wherein the alignment base and the sawing base comprise a plurality of mounting studs and the nest comprises a plurality of mounting openings configured to engage the mounting studs.

4. The system of claim 1 further comprising a clamping mechanism attachable to the nest configured to clamp the substrate to the nest, the clamping mechanism comprising a plurality of second locator pins configured to engage the locator openings.

5. A system for singulating semiconductor components contained on a substrate having a plurality of locator openings comprising:

a nest configured to hold the substrate comprising a plurality of openings;

alignment base configured to support the nest and to align the substrate on the nest, the alignment base comprising a plurality of locator pins configured with the nest on the alignment base to project from the openings on the nest and to engage the locator openings to align the substrate on the nest a sawing base configured to support the nest and to apply a vacuum to the substrate to hold the substrate on the nest for sawing; and wherein the sawing base comprises a plurality of pedestals having vacuum openings configured to apply the vacuum to the substrate.

6. The system of claim 5 wherein the sawing base comprises a plurality of pedestals having vacuum openings for applying the vacuum and the nest comprises a plurality of pedestal openings for receiving the pedestals.

7. The system of claim 5 wherein the substrate comprises a panel with the components thereon in at least one row.

8. The system of claim 5 wherein the substrate comprises a panel with the components thereon arranged in one or more matrix arrays.

9. The system of claim 5 further comprising a saw blade configured to saw the substrate held on the nest.

10. The system of claim 5 further comprising a clamping mechanism attachable to the nest configured to clamp the substrate on the nest.

11. The system of claim 5 further comprising a clamping mechanism attachable to the nest configured to clamp the substrate on the nest, the clamping mechanism comprising a plurality of second locator pins configured to engage the locator openings.

12. A system for singulating semiconductor components contained on a substrate having a plurality of locator openings comprising:

a nest configured to hold the substrate comprising a plurality of openings;

a clamping mechanism attachable to the nest for clamping the substrate to the nest;

an alignment base configured to support the nest and to align the substrate on the nest, the alignment base comprising a plurality of locator pins configured to project from the openings in the nest and to engage the locator openings;

a sawing base comprising a vacuum opening configured to apply a vacuum to the substrate held on the nest; and a saw blade configured to saw the substrate held in the nest on the sawing base.

13. The system of claim 12 wherein the nest comprises a plurality of mounting openings, the alignment base comprises a plurality of first mounting studs for engaging the mounting openings, and the sawing base comprises a plurality of second mounting studs for engaging the mounting openings.

14. The system of claim 12 wherein the clamping mechanism comprises a plurality of second locator pins configured to engage the locator openings on the substrate supported by the alignment base.

15. The system of claim 12 wherein the alignment base comprises a plurality of recesses for retaining the components.

16. The system of claim 12 wherein the sawing base comprises at least one pedestal for supporting the components and the vacuum opening is located in the pedestal.

17. The system of claim 12 wherein the clamping mechanism comprises at least one latch and the nest comprises at least one slot for engaging the latch.

18. The system of claim 12 wherein the components comprise an element selected from the group consisting of packages, multi chip modules, printed circuit boards, interconnects, bumped dice and bare dice.

19. The system of claim 12 wherein the substrate comprises a panel and the components comprise packages on the panel.

20. The system of claim 12 wherein the substrate comprises a panel and the components comprise packages arranged on the panel in one or more matrix arrays.

21. A system for singulating semiconductor components contained on a substrate having a plurality of locator openings comprising:

a nest configured to hold the substrate;

a clamping mechanism attachable to the nest for clamping the substrate to the nest, the mechanism comprising a plurality of locator pins configured to engage the locator openings to align the substrate on the nest; and a sawing base comprising a vacuum opening configured to apply a vacuum to the substrate held on the nest.

22. The system of claim 21 further comprising an alignment base configured to support the nest with the clamping mechanism attached thereto, the alignment base comprising a plurality of second locator pins configured to engage the locator openings to align the substrate on the nest.

23. The system of claim 21 wherein the nest comprises a plurality of opening for receiving the locator pins.

24. The system of claim 21 wherein the nest comprises a plurality of mounting openings and the sawing base comprises a plurality of mounting studs for engaging the mounting openings.

25. A system for singulating semiconductor components contained on a substrate having a plurality of locator openings comprising:

a nest configured to hold the substrate comprising a plurality of openings aligned with the locator openings, a plurality of recesses configured to retain the components and a plurality of pedestal openings;

an alignment base configured to support the nest and to align the substrate on the nest, the alignment base comprising a plurality of locator pins configured with the nest on the alignment base to project from the openings on the nest and to engage the locator openings to align the substrate on the nest; and a sawing base configured to support the nest and the substrate thereon for sawing, the sawing base comprising a plurality of pedestals configured to project from the pedestal openings and vacuum openings in the pedestals configured to apply a vacuum to the components.

26. The system of claim 25 further comprising a clamping mechanism attachable to the nest for clamping the substrate on the nest.

27. The system of claim 26 wherein the clamping mechanism comprises a plurality of second locator pins configured with the nest on the alignment base to engage the locator openings.

* * * * *

UNITED STATES PATENT AND TRADEMARK OFFICE
CERTIFICATE OF CORRECTION

PATENT NO. : 6,683,378 B2
DATED : January 27, 2004
INVENTOR(S) : Jason C. Wing and Gregory M. Chapman

It is certified that error appears in the above-identified patent and that said Letters Patent is hereby corrected as shown below:

<u>Column 10,</u>
Line 3, before "alignment" add -- an --.
Line 8, after "nest" add a semicolon -- ; --.
Lines 14-15, remove "the sawing base comprises a plurality of pedestals having vacuum openings for applying the vacuum and".

<u>Column 11,</u>
Line 26, change "opening" to -- openings --.

Signed and Sealed this

Sixth Day of April, 2004

JON W. DUDAS
*Acting Director of the United States Patent and Trademark Office*